(12) United States Patent
Lin

(10) Patent No.: US 7,030,670 B2
(45) Date of Patent: Apr. 18, 2006

(54) PRECISE SLEW RATE CONTROL LINE DRIVER

(75) Inventor: Joanna Lin, Taipei Hsien (TW)

(73) Assignee: Via Technologies Inc., Taipei Hsien (TW)

( * ) Notice: Subject to any disclaimer, the term of this patent is extended or adjusted under 35 U.S.C. 154(b) by 12 days.

(21) Appl. No.: 10/710,763

(22) Filed: Aug. 2, 2004

(65) Prior Publication Data
US 2005/0122146 A1    Jun. 9, 2005

(30) Foreign Application Priority Data
Dec. 4, 2003    (TW) .............................. 92134162 A

(51) Int. Cl.
*H03K 5/12*    (2006.01)

(52) U.S. Cl. ...................... 327/170; 327/112
(58) Field of Classification Search ................ 327/170, 327/112
See application file for complete search history.

(56) References Cited

U.S. PATENT DOCUMENTS

| 5,850,159 | A | * | 12/1998 | Chow et al. | ................. 327/170 |
| 6,271,699 | B1 | * | 8/2001 | Dowlatabadi | ............... 327/170 |
| 6,700,422 | B1 | * | 3/2004 | Tang et al. | ................. 327/170 |
| 6,842,058 | B1 | * | 1/2005 | McNitt et al. | ............. 327/170 |

* cited by examiner

*Primary Examiner*—Long Nguyen
(74) *Attorney, Agent, or Firm*—Winston Hsu

(57) ABSTRACT

A precise slew rate control line driver includes a slew rate control circuit, a first driver, and a second driver. The slew rate control circuit for slew rate control includes a first operational amplifier and a second operational amplifier. The first driver for driving output signal includes a first current source, a second current source, a first group of switches, and a second group of switches. The second driver for predetermined transient slope includes a capacitor, a third current source, a fourth current source, a third group of switches, and a fourth group of switches.

12 Claims, 4 Drawing Sheets

PRECISE SLEW RATE CONTROL LINE DRIVER

BACKGROUND OF INVENTION

1. Field of the Invention

The present invention relates to a line driver, and more specifically, to a line driver capable of controlling the slew rate or waveform of output signals.

2. Description of the Prior Art

As the requirements of computer networks and data communication increase, data transmission has been improved in cooperation with technologies in communication system, signal processing, and very large-scale integration (VLSI). The appearance of VLSI allows more digital processing systems and analog front-end blocks to be integrated onto a single chip so that the cost can be lowered and be more competitive. Since the analog front-end blocks are integrated into a digital circuit, a lower voltage source is required in accordance with the minimization of VLSI. As voltage sources have become lower and lower, it becomes more difficult to satisfy the requirements in operation speed, signal amplitude, and linearity of an analog circuit.

A general communication system utilizes a transceiver for data transmission. The transceiver includes a line driver for transmitting output signals to different loads of impedance including capacitive and resistive impedances. In addition, the line driver is required to sustain transmission in high linearity. Therefore, the line driver needs to be capable of driving different kinds of impedance loads while lowering harmonic distortion as much as possible. The line driver is also required to keep the output amplitude with an acceptable dynamic range. In order to fulfill those requirements of the output signals of the line driver on rail-to-rail output amplitude and the requirements of high output currents on quiescent current ratio, the line driver generally utilizes complimentary class-AB output stage. In general, the class-AB output stage utilizes two complementary head-to-tail transistors to conduct a level shift between the gate voltages of output transistors. Another preferred method is to adjust the quiescent current to make an optimal balance between speed and power without requiring the redesign of part of the circuit, for example, detecting signal cross and corresponding complementary quiescent current from clock information converted from output signals.

As described above, the transceiver outputs signals to a transmission line via the line driver; thus the slew rate, rising time, and falling time of the output signals of the line driver is limited because of the transceiver. Since the load of the line driver may be very large, if there is no slew rate control, it is hardly possible for output signals to comply with the standard required because of the operation, the power source, and the temperature variation. Although most of the line drivers apply such kind of slew rate control, it is disadvantageous in that the circuit is too complicated or that the slew rate cannot be precisely controlled. Moreover, in some slew rate control, matching currents are required because mismatch between current sources may cause unbalance signal waveform.

SUMMARY OF INVENTION

It is therefore a primary objective of the present invention to provide a line driver with a simple structure, being capable of precisely controlling output signals and not needing matching current sources, in order to solve the problems in the prior art.

Briefly summarized, a precise slew rate control line driver includes a slew rate control circuit for controlling the slew rate, a first driver for driving output signals, and a second driver for setting up transient slope. The slew rate control circuit for controlling the slew rate includes a first operational amplifier comprising a positive input end, a negative input end, and an output end; and a second operational amplifier comprising a positive input end connected to the positive input end of the first operational amplifier, a negative input end connected to the negative input end of the first operational amplifier, and an output end. The first driver for driving output signals includes a first current source comprising a first end connected to a voltage source, a second end connected to the positive input end of the first operational amplifier, and a control end connected to the output end of the first operational amplifier or the voltage end via a first group of switches; and a second current source comprising a first end connected to the positive input end of the second operational amplifier, a second end connected to a ground end, and a control end connected to the output end of the second operational amplifier or the ground end via a second group of switches. The second driver for setting up transient slope includes a capacitor comprising a first end connected to the negative end of the first operational amplifier and a second end connected to the ground end; a third current source comprising a first end connected to the voltage source; a second source connected to the first end of the capacitor and a control end connected to a first bias signal source or the voltage source via a third group of switches; and a fourth current source comprising a first end connected to the first end of the capacitor, a second source connected to the ground end, and a control end connected to a second bias signal source or the ground end via a fourth group of switches.

The present invention further provides a method for controlling the line driver described above. The method includes (a) switching the first group of switches within the line driver to connect the control end of the first current source with the output end of the first operational amplifier, switching the second group of switches within the line driver to connect the control end of the second current source with the ground end, switching the third group of switches within the line driver to connect the control end of the third current source with the first bias signal source, and switching the fourth group of switches within the line driver to connect the control end of the fourth current source with the ground end, and (b) switching the first group of switches within the line driver to connect the control end of the first current source with the voltage source, switching the second group of switches within the line driver to connect the control end of the second current source with the output end of the second operational amplifier, switching the third group of switches within the line driver to connect the control end of the third current source with the voltage source, and switching the fourth group of switches within the line driver to connect the control end of the fourth current source with the second bias signal source.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
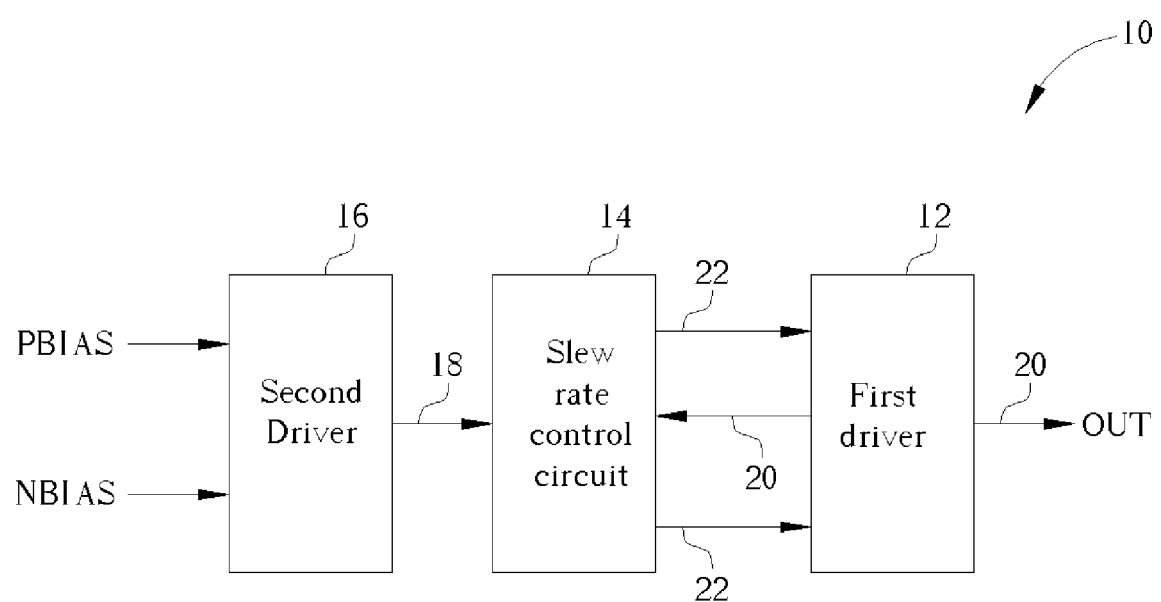
FIG. 1 is a block diagram of line driver according to the present invention.

Please refer to FIG. 1 showing a block diagram of line driver 10 according to the present invention. The line driver 10 includes three parts, which are a first driver 12, a slew rate control circuit 14, and a second driver 16. An output end (OUT) of the line driver 10 is connected to an unknown load (not shown), which may interfere with the output signals 20 of the line driver 10. In addition to that, temperature change or unstableness of the voltage source may also interfere the output signals 20. In order to have the output signals 20 of the line driver 10 comply with a predetermined standard, firstly design the second driver 16 according to the predetermined standard, so that the output signal of the line driver 10 can avoid disturbance. The second driver 16 is connected to a first bias signal source (PBIAS) and a second bias signal source (NBIAS). The first bias signal is from a bias PMOS transistor, the second bias signal is from a bias NMOS transistor, and both bias sources are positive, which will be further described in FIG. 4. The second driver 16 generates output signals 18 according to the two bias signals, and the transient slope of the output signals 18 can be adjusted by setting up the device value of the second driver 16. Furthermore, the output signals 20 of the first driver 12 are the output signals 20 of the line driver 10. Since the first driver 12 and the slew rate control circuit 14 are connected in a negative feedback loop, the output signals 20 of the first driver 12 are sent back to the slew rate control circuit 14. The slew rate control circuit 14 can in real-time compare the output signals 20 of the first driver 12 with the output signals 18 of the second driver 16, and then output control signals 22 to the first driver 12 to make the transient slope of the output signals 20 of the first driver 12 be the same as the transient slope of the output signals 18 of the second driver 16. Therefore, whatever the load connected to the output end of the line driver 10 is, the output signals 20 of the first driver 12 will follow the output signals 18 of the second driver 16 so that the output signals 20 of the first driver 12 can comply with the predetermined standard.

Figure 2:
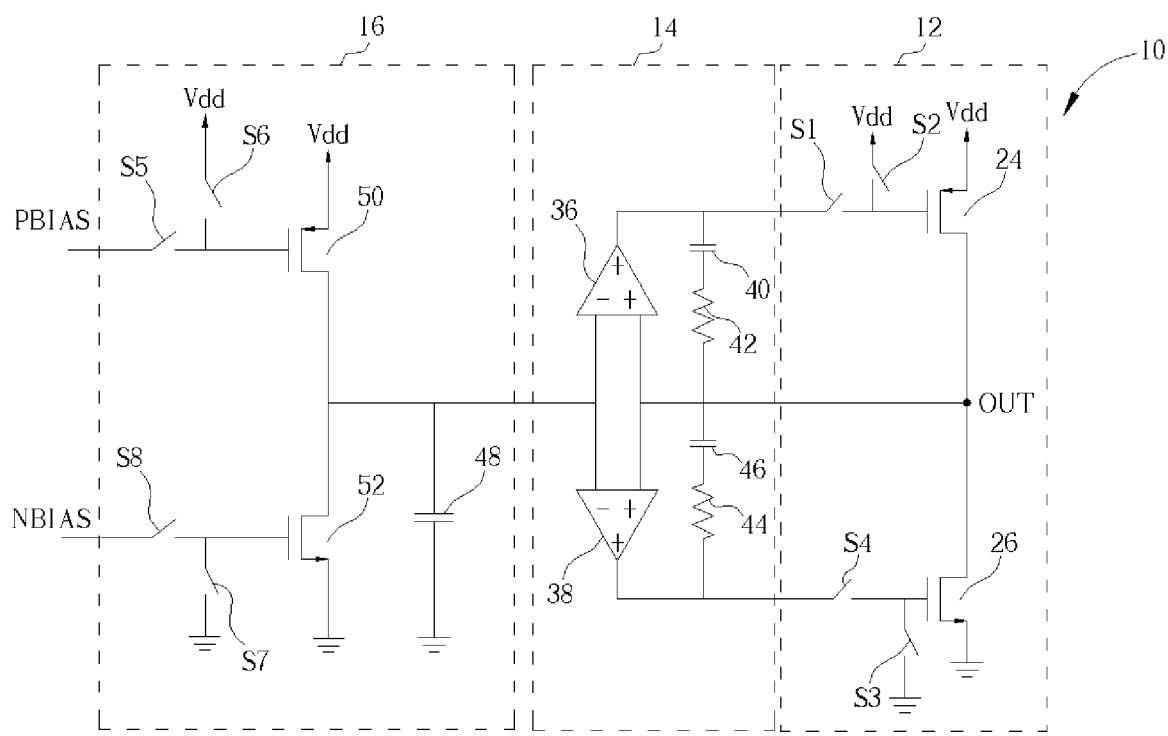
FIG. 2 is a circuit diagram of the line driver according to the present invention.

Please refer to FIG. 2 showing a circuit diagram of the line driver 10 according to the present invention as well as FIG. 1. The first driver 12 includes a first PMOS transistor 24, a first NMOS transistor 26, a first group of switches S1, a second group of switches S2, a third group of switches S3 and a fourth group of switches S4. The slew rate control circuit 14 includes a first operational amplifier 36, a second operational amplifier 38, a first capacitor 40, a first resistance 42, a second capacitor 46, and a second resistance 44. The second driver 16 includes a capacitor 48, a second PMOS transistor 50, a second NMOS transistor 52, a fifth group of switches S5, a sixth group of switches S6, a seventh group of switches S7, and a eighth group of switches S8. A source of the first PMOS transistor 24 is connected to a voltage source (Vdd), a drain is connected to a positive input end of the first operational amplifier 36, and a gate can be connected to an output end of the first operational amplifier 36 via the first group of switches S1 or be connected to the voltage source via the second group of switches S2. A drain of the first NMOS transistor 26 is connected to a positive input end of the second operational amplifier 38, a source is connected to a ground end, and a gate can be connected to the ground end via the third group of switches S3, or be connected to an output end of the second operational amplifier 38 via the fourth group of switches S4. The first capacitor 40 and the first resistor 42 are connected serially between the positive input end and the output end of the first operational amplifier 36 to serve as the frequency complement of the first operational amplifier 36. The second capacitor 46 and the second resistor 44 are connected serially between the positive input end and the output end of the second operational amplifier 38 to serve as the frequency complement of the second operational amplifier 38. The positive input end of the first operational amplifier 36 is connected to the positive input end of the second operational amplifier 38, and a negative input end of the first operational amplifier 36 is connected to a negative input end of the second operational amplifier 38. A first end of the capacitor 48 is connected to the negative input end of the first operational amplifier 36, and a second end is connected to the ground end. A source of the second PMOS transistor 50 is connected to a voltage source, a drain is connected to the first end of the capacitor 48, and a gate can be connected to the first bias signal source via the fifth group of switches S5 or be connected to the voltage source via the sixth group of switches S6. A drain of the second NMOS transistor 52 is connected to the first end of the capacitor 48, a source is connected to the ground end, and a gate can be connected to the ground end via the seventh group of switches S7 or be connected to the second bias signal source via the eighth group of switches S8.

The line driver 10 generates loops by switching the first to the eighth group of switches in order to drive output signals. Odd numbered switches (the first, the third, the fifth, the seventh) are synchronized, and Even numbered switches (the second, the fourth, the sixth, the eighth) are synchronized with the synchronization of odd numbered and even numbered switches being inverse to each other. In the case of turning on the odd numbered switches and turning off the even numbered switches, the negative feedback loop of the first operational amplifier 36 is formed. The gate of the second PMOS transistor 50 is connected to the first bias signal source. The first bias signal controls the second PMOS transistor 50 to conduct the current in order to charge the capacitor 48. The first operational amplifier 36 compares signals at the positive and negative ends and outputs the control signal to the gate of the first PMOS transistor 24 to make the output signal of the first PMOS transistor 24 be the same as the output signal of the second PMOS transistor 50. In the case of turning off the odd numbered switches and turning on the even numbered switches, the negative feedback loop of the second operational amplifier 38 is formed. The gate of the second NMOS transistor 52 is connected to the second bias signal source. The second bias signal controls the second NMOS transistor 52 to conduct the current in order to discharge the capacitor 48. The second operational amplifier 38 compares signals at the positive and negative ends, and outputs the control signal to the gate of the first NMOS transistor 26 to make the output signal of the first NMOS transistor 26 be the same as the output signal of the second NMOS transistor 52. In the above description, the first driver 12 and the second driver 16 do not require matching currents because the operational amplifier can in real-time track the voltage change at the positive and the negative ends, i.e. transient slope of signal. Therefore, the first driver 12 and the second driver 16 will eventually obtain the same transient slope of signal, no matter what the load connected to the output end of the line driver 10 is. Please notice that since the voltage of input signals at the positive and the negative ends of the operational amplifier is from 0 to Vdd, the first operational amplifier 36 and the second operational amplifier 38 must be inputs rail-to-rail operational amplifiers.

Figure 3:
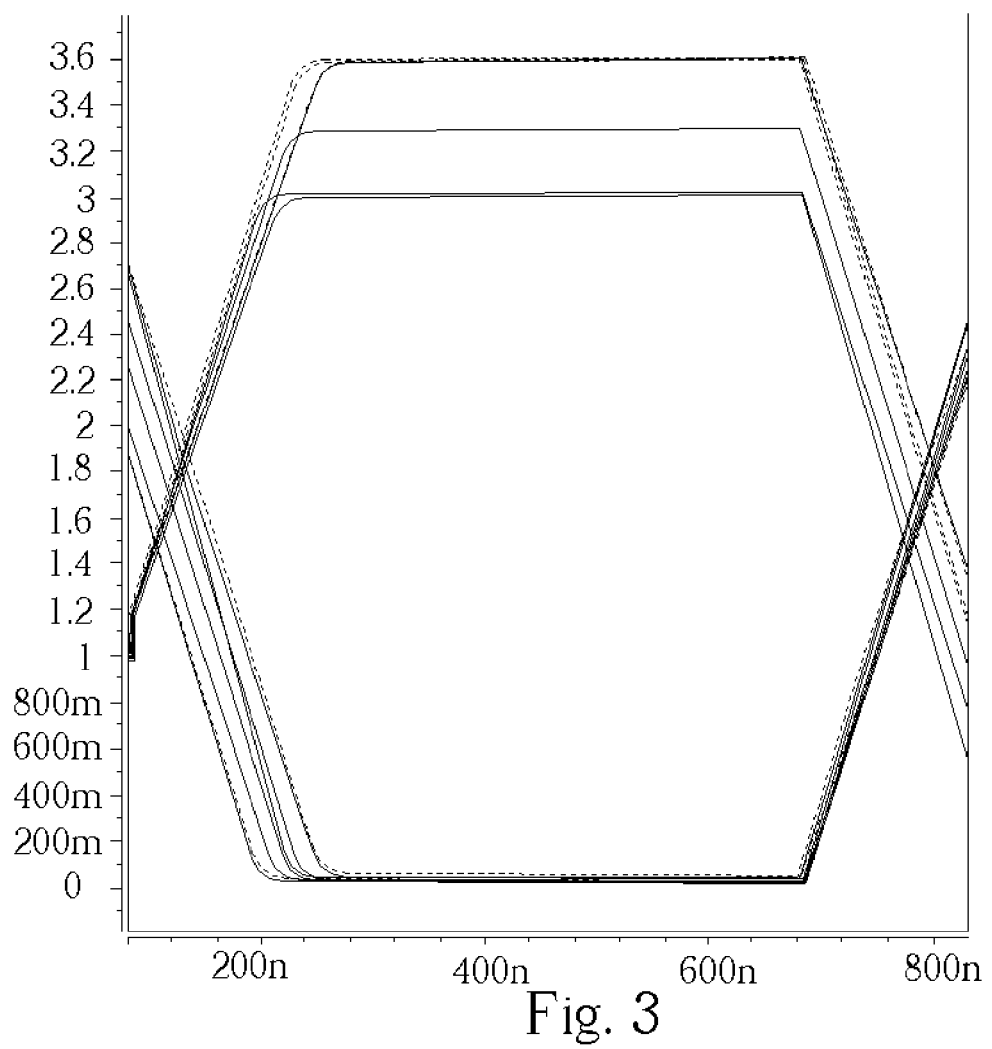
FIG. 3 illustrates simulation data of the line driver according to the present invention.

Please refer to FIG. 3 showing simulation data of the line driver 10 according to the present invention. For different standards, the transient slope of signal can be adjusted by setting up the output currents of the capacitor 48 and the transistors 50, 52 in the second driver 16. As for the USB 1.1 LS standard, the rising time and the falling time of the input signal must be from 75 ns to 300 ns with the capacitor load being from 150 p to 600 p, and the positive and negative outputs having different resistor loads. According to this standard and the capacitor's formula $dV/dT=I/C$ wherein dV is 0.8*Vdd with Vdd=3.3V, dT is 150 ns the geometric mean of 75 ns and 300 ns, I is operating current 25 μ, then C=1.42 p. Such kind of capacitance is easy to implement on a chip. Assuming that I is obtained from the reference external resistance which can be controlled with a variation of 5%, C can then be implemented by a MOS transistor oxide capacitance having a variation of 10%, and Vdd can also have a variation of 10%. In such a manner, without any modification, the transient slope can be controlled with a worst-case variation within 25%, and improved to a variation about 20% with circuit simulation.

Figure 4:
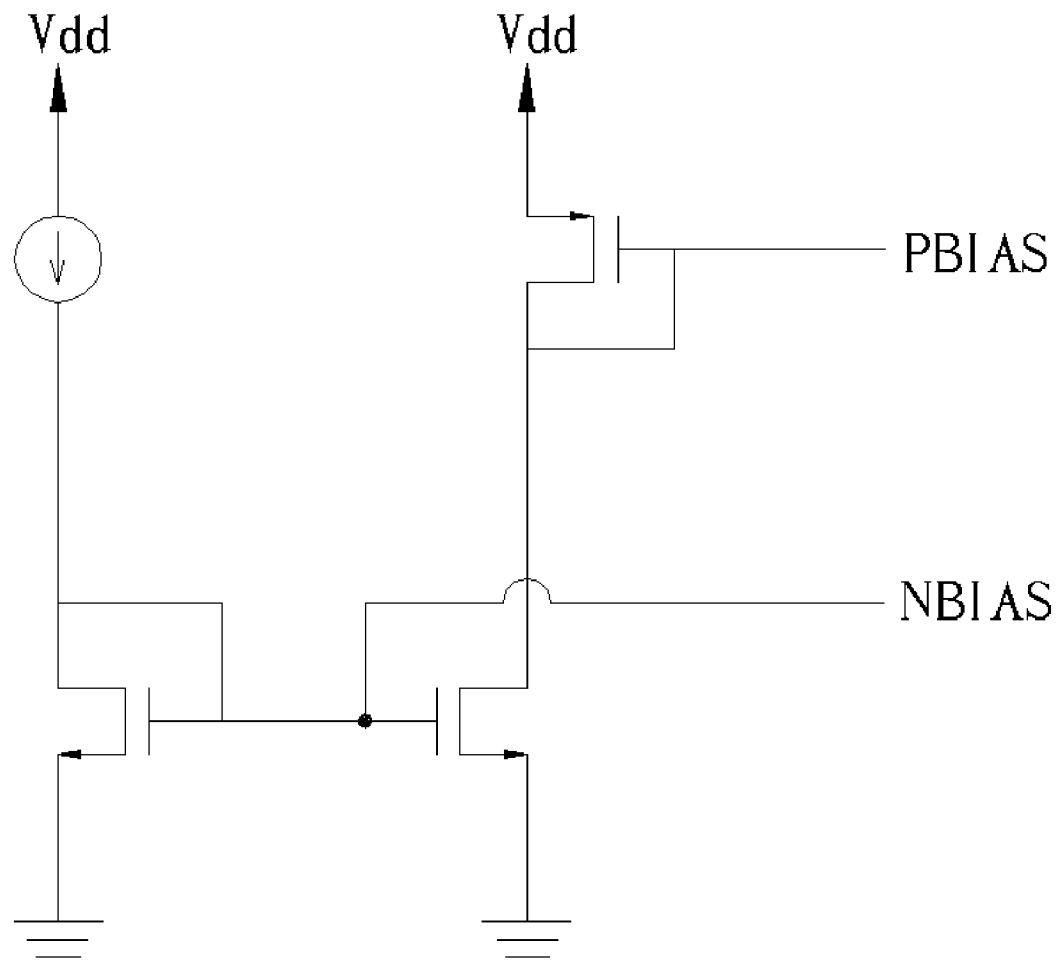
FIG. 4 illustrates a generating circuit of the bias signal source in FIG. 1.

The first and the second bias signal sources (PBIAS, NBIAS) received by the second driver 16 are shown as FIG. 4. FIG. 4 shows a generating circuit of the bias signal source in FIG. 1. The first bias source (PBIAS) and the second bias source (NBIAS) are from a set of circuits prior to the line driver 10, which are composed of a current mirror. The first bias signal is from a bias PMOS transistor and the second bias signal is from a bias NMOS transistor. The first bias signal and the second bias signal are for providing a proper voltage to the second driver 16.

In contrast to the prior art, the line driver according to the present invention has many advantages. First, the line driver includes the first driver, the slew rate control circuit, and the second driver, making the line driver simple in structure. Second, since the line driver is simple in structure, it has a flexible circuit design in that only a part of the device values is required to be changed for different standards. Third, the line driver can precisely control output signal change without any problem in the device or current matching. Fourth, it can be known by circuit simulation that the rising time and the falling time of the input signal are symmetrical to each other, and the cross point is at half of the voltage sources. Fifth, the output signals are not interfered with even if the output end of the line driver is connected to a large capacitor load or resistor load.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A precise slew rate control line driver comprising:
    a slew rate control circuit for controlling slew rate comprising:
        a first operational amplifier comprising a positive input end, a negative input end, and an output end; and
        a second operational amplifier comprising a positive input end connected to the positive input end of the first operational amplifier, a negative input end connected to the negative input end of the first operational amplifier, and an output end;
    a first driver for driving output signals comprising:
        a first current source comprising a first end connected to a voltage source, a second end connected to the positive input end of the first operational amplifier, and a control end connected to the output end of the first operational amplifier or the voltage source via a first group of switches; and
        a second current source comprising a first end connected to the positive input end of the second operational amplifier, a second end connected to a ground end, and a control end connected to the output end of the second operational amplifier or the ground end via a second group of switches; and
    a second driver for setting up transient slope comprising:
        a capacitor comprising a first did connected to the negative end of the first operational amplifier, and a second end connected to the ground end;
        a third current source comprising a first end connected to the voltage source, a second source connected to the first end of the capacitor, and a control end connected to a first bias signal source or the voltage source via a third group of switches; and
        a fourth current source comprising a first end connected to the first end of the capacitor, a second source connected to the ground end, and a control end connected to a second bias signal source or the ground end via a fourth group of switches.

2. The line driver of claim 1 wherein the first current source and the third current source are PMOS transistors with a drain as the first end, a source as the second end, and a gate as the control end.

3. The line driver of claim 1 wherein the second current source and the fourth current source are NMOS transistors with a drain as the first end, a source as the second end, and a gate as the control end.

4. The line driver of claim 1 wherein the first group of switches comprises two switches for switching the control end of the first current source to be connected to the voltage source or the output end of the first operational amplifier.

5. The line driver of claim 1 wherein the second group of switches comprises two switches for switching the control end of the second current source to be connected to the ground end or the output end of the second operational amplifier.

6. The line driver of claim 1 wherein the third group of switches comprises two switches for switching the control end of the third current source to be connected to the voltage source or the first bias signal source.

7. The line driver of claim 1 wherein the fourth group of switches comprises two switches for switching the control end of the fourth current source to be connected to the ground end or the second bias signal source.

8. The line driver of claim 1 further comprising a first capacitor and a first resistor connected serially between the positive input end and the output end of the first operational amplifier.

9. The line driver of claim 1 further comprising a second capacitor and a second resistor connected serially between the positive input end and the output end of the second operational amplifier.

10. The line driver of claim 1 wherein the first operational amplifier and the second operational amplifier are inputs rail-to-rail operational amplifiers.

11. A method for controlling the line driver said in claim 1, said method comprising:

(a) switching the first group of switches within the line driver to connect the control end of the first current source with the output end of the first operational amplifier;
switching the second group of switches within the line driver to connect the control end of the second current source with the ground end;
switching the third group of switches within the line driver to connect the control end of the third current source with the first bias signal source; and
switching the fourth group of switches within the line driver to connect the control end of the fourth current source with the ground end; and (b) switching the first group of switches within the line driver to connect the control end of the first current source with the voltage source;

switching the second group of switches within the line driver to connect the control end of the second current source with the output end of the second operational amplifier;
switching the third group of switches within the line driver to connect the control end of the third current source with the voltage source; and
switching the fourth group of switches within the line driver to connect the control end of the fourth current source with the second bias signal source.

12. The method of claim 11 wherein steps (a) and (b) are performed in different periods of time.

* * * * *